(12) United States Patent
Sung et al.

(10) Patent No.: US 10,056,529 B2
(45) Date of Patent: Aug. 21, 2018

(54) PHOTO-CONVERSION COMPLEX, AND PHOTO-CONVERSION MEMBER, DISPLAY DEVICE, AND LIGHT-EMITTING DEVICE PACKAGE INCLUDING THE SAME, AND METHOD OF FABRICATING THE SAME

(71) Applicant: LG ELECTRONICS INC., Seoul (KR)

(72) Inventors: Jinwoo Sung, Seoul (KR); Seongman Jeon, Seoul (KR); Dongseon Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 28 days.

(21) Appl. No.: 15/267,411

(22) Filed: Sep. 16, 2016

(65) Prior Publication Data

US 2017/0084796 A1   Mar. 23, 2017

(30) Foreign Application Priority Data

Sep. 18, 2015   (KR) .................. 10-2015-0132544

(51) Int. Cl.
*H01L 33/50*   (2010.01)
*G02F 1/1335*   (2006.01)

(52) U.S. Cl.
CPC ...... *H01L 33/502* (2013.01); *G02F 1/133603* (2013.01); *G02F 2001/133614* (2013.01); *G02F 2202/36* (2013.01); *H01L 2224/48091* (2013.01)

(58) Field of Classification Search
CPC ......... H01L 33/502; H01L 2224/48091; G02F 1/133603; G02F 1/133617; G02F 2001/133614; G02F 2002/36; G02F 1/133615; C09K 11/02; C09K 11/565; C09K 11/883; C09K 11/025; G02B 6/0073
USPC ........... 349/69–71; 257/98; 362/84; 977/774
See application file for complete search history.

(56) References Cited

U.S. PATENT DOCUMENTS

| | | | | |
|---|---|---|---|---|
| 2007/0012355 A1* | 1/2007 | LoCascio | ............... | B82Y 20/00 136/252 |
| 2010/0103648 A1* | 4/2010 | Kim | ..................... | H01L 33/507 362/97.1 |
| 2011/0068321 A1* | 3/2011 | Pickett | ................. | C09K 11/025 257/13 |
| 2011/0096530 A1* | 4/2011 | Shimizu | ................. | H05B 33/12 362/97.2 |
| 2011/0249424 A1* | 10/2011 | Joo | ......................... | H01L 33/50 362/97.1 |
| 2012/0113672 A1* | 5/2012 | Dubrow | ................. | B82Y 20/00 362/602 |

(Continued)

FOREIGN PATENT DOCUMENTS

JP   2014-127563 A   7/2014
KR   10-2013-0109196 A   10/2013
(Continued)

*Primary Examiner* — Edward Glick
*Assistant Examiner* — Shan Liu
(74) *Attorney, Agent, or Firm* — Birch, Stewart, Kolasch & Birch, LLP

(57) ABSTRACT

A photo-conversion complex including at least one photo-conversion particle including a core nanocrystal, a shell nanocrystal surrounding the core nanocrystal, and a ligand bonded to the shell nanocrystal; and a protective film surrounding the photo-conversion particle.

20 Claims, 11 Drawing Sheets

(56) References Cited

U.S. PATENT DOCUMENTS

| | | | |
|---|---|---|---|
| 2013/0189803 A1* | 7/2013 | Nasaani | C09K 11/02 |
| | | | 438/27 |
| 2014/0027713 A1* | 1/2014 | Cox | H01L 21/02439 |
| | | | 257/13 |
| 2015/0048403 A1 | 2/2015 | Dan et al. | |
| 2015/0260373 A1* | 9/2015 | Li | C09K 11/565 |
| | | | 362/355 |
| 2015/0286094 A1* | 10/2015 | Jung | G02F 1/1336 |
| | | | 362/84 |
| 2016/0211409 A1* | 7/2016 | Kazama | H01L 33/06 |
| 2017/0306221 A1* | 10/2017 | Koole | C09K 11/025 |

FOREIGN PATENT DOCUMENTS

| | | |
|---|---|---|
| KR | 10-2013-0120486 A | 11/2013 |
| KR | 10-2015-0071004 A | 6/2015 |

\* cited by examiner

3160

PHOTO-CONVERSION COMPLEX, AND PHOTO-CONVERSION MEMBER, DISPLAY DEVICE, AND LIGHT-EMITTING DEVICE PACKAGE INCLUDING THE SAME, AND METHOD OF FABRICATING THE SAME

CROSS-REFERENCE TO RELATED APPLICATIONS

The present application claims priority under 35 U.S.C. § 119 and 35 U.S.C. § 365 to Korean Patent Application No. 10-2015-0132544 filed Sep. 18, 2015, which is hereby incorporated by reference in its entirety.

BACKGROUND OF THE INVENTION

Field of the Invention

The present disclosure relates to a photo-conversion complex, and a photo-conversion member, a display device, and a light-emitting device package including the same, and a method of fabricating the same Description of the Related Art Some display devices need a backlight unit to generate light in order to display an image. In more detail, the backlight unit supplies light to a display panel including a liquid crystal, and includes a light-emitting device and a mechanism for effectively transmitting the light output from the light-emitting device to the liquid crystal.

Further, a light emitting diode (LED) or the like can be used as a light source of such a display device. Also, an optical sheet may be stacked so that the light output from the light source is effectively transmitted to a display panel side. In this instance, the wavelength of the light generated from the light source can be changed so that an optical member that enables a white light to enter the display panel may be applied to such a display device. Especially, a quantum dot or the like can be used in order to change the wavelength of light.

However, such a quantum dot has a limitation in that it has a higher extinction coefficient and higher quantum yield in comparison to a phosphor, and is significantly vulnerable to moisture and oxygen that may be permeated from the outside.

SUMMARY OF THE INVENTION

Accordingly, one object of the present invention is to address the above-noted and other problems.

Another object of the present invention is to provide a novel photo-conversion complex including at least one photo-conversion particle including a core nanocrystal, a shell nanocrystal surrounding the core nanocrystal, and a ligand bonded to the shell nanocrystal; and a protective film surrounding the photo-conversion particle. The present invention also provides a corresponding photo-conversion member, display device and light-emitting package including the photo-conversion complex.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DETAILED DESCRIPTION OF THE EMBODIMENTS

Figure 1:
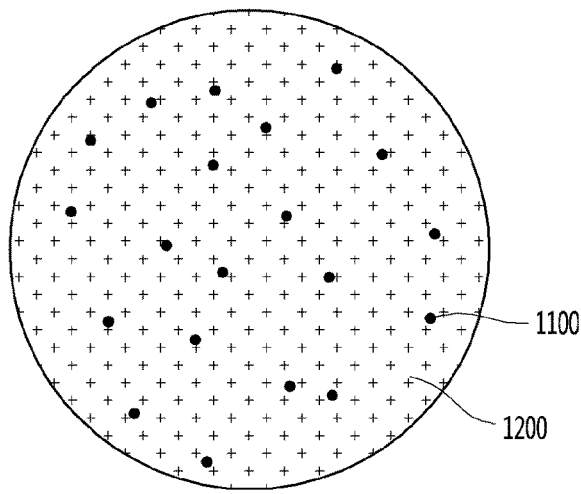
FIG. 1 is a cross-sectional view of a photo-conversion complex according to an embodiment.

Advantages and features of the present disclosure, and implementation methods thereof will be clarified through following embodiments described with reference to the accompanying drawings. Since a shape, a size, a ratio, an angle, a number, etc., which are shown in the accompanying drawings to explain an embodiment are exemplarily illustrated, the present disclosure is not limited thereto. Like reference numerals refer to like elements throughout the present disclosure. Moreover, detailed descriptions related to well-known functions or configurations will be ruled out in order not to unnecessarily obscure subject matters of the present disclosure.

When 'comprising', 'having', 'consisting of', or the like is used, other components can be added unless 'only' is used. A singular component includes plural components unless otherwise specified. In construing a component, it is construed that an error range is included even if there is no separate explicit mention.

When describing a location relationship between two components by using e.g., 'on', on the top of', 'under', or 'next to', another component may also be located between the two components unless 'directly' is not represented in a corresponding sentence. Also, when the 'upper portion' and 'lower portion' of a backlight unit of the present disclosure are applied to a display device, a side relatively closer to the display panel is defined as the upper portion and a side relatively farther from the display panel is defined as the lower portion. Also, when the 'upper portion' and 'lower portion' of the display panel of the present disclosure is applied to the display device, a side relatively closer to the backlight unit is defined as the lower portion and a side relatively farther from the backlight unit is defined as the upper portion. In describing a temporal relationship, a case where a temporal sequence is described as e.g., 'after', 'subsequent to', 'following', or 'before' also includes a discontinuous case unless 'immediately' or 'directly' is not used.

Although the terms "first", "second" or the like are used herein to describe various components, these components are not limited by these terms. These terms are only used to distinguish one component from another component. Thus, a first component that is mentioned below may also be a second component within the technical spirit of the present disclosure.

Features of various embodiments may be partially or entirely coupled or combined with each other, and may be technically linked and operated in various manners. Also, the embodiments may also be performed independently from each other or in conjunction with each other. In the following, embodiments are described in detail with reference to the accompanying drawings. The following embodiments are provided as examples for fully conveying the spirit of the present disclosure to a person skilled in the art. Thus, the present disclosure may not be limited to the following embodiments and may also be implemented in other forms.

Figure 2:
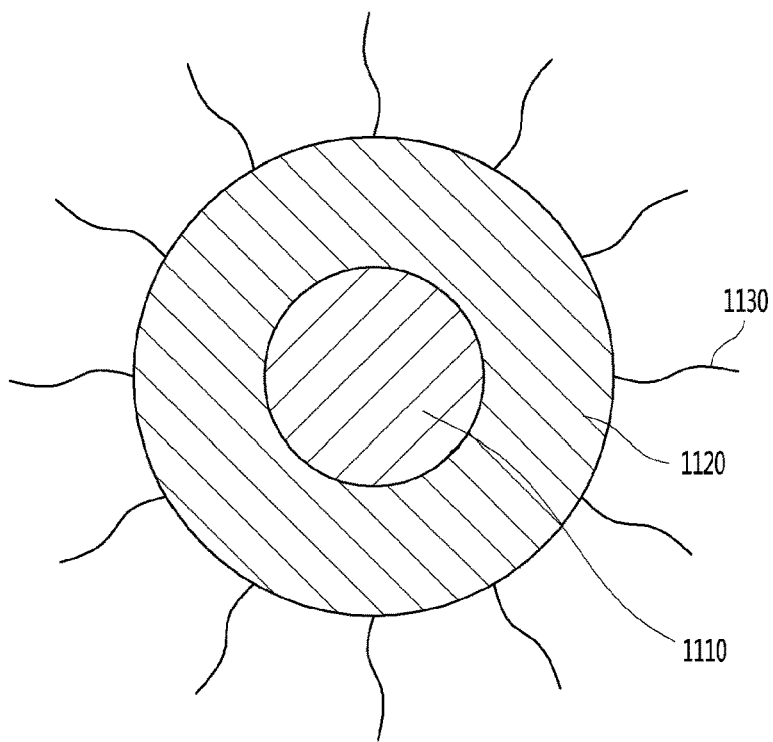
FIG. 2 is a cross-sectional view of a photo-conversion particle according to an embodiment.
Figure 3:
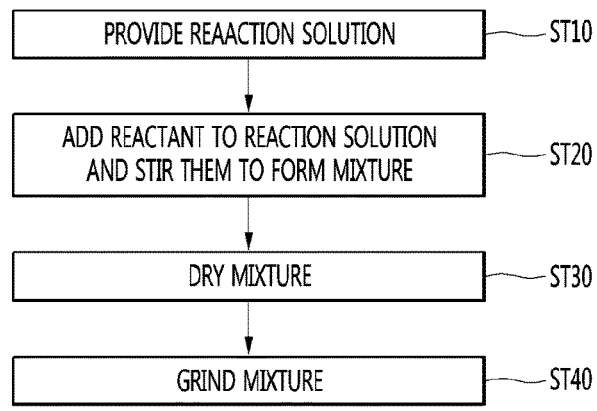
FIG. 3 is a flowchart of a method of fabricating a photo-conversion complex according to an embodiment.

Referring to FIGS. 1 to 3, a photo-conversion complex and a method of fabricating the same according to embodiments are described below. Referring to FIG. 1, a photo-conversion complex 1000 according to an embodiment includes a photo-conversion particle 1100 and a protective film 1200 that surrounds the photo-conversion particle 1100.

At least one photo-conversion particle 1100 may be disposed in the protective film 1200. Further, the photo-conversion particle 1100 may be uniformly dispersed in the protective film 1200, be inserted into the protective film 1200, and/or be surrounded by the protective film 1200. The photo-conversion particle 1100 may also be sealed by the protective film 1200.

Further, the photo-conversion particle 1100 may include a first photo-conversion particle and a second photo-conversion particle. For example, the first photo-conversion particle can convert a blue light into a green light and the second photo-conversion particle can convert the blue light into a red light.

In addition, the first photo-conversion particle may include a photo-conversion fluorescent material and the second photo-conversion particle may include a photo-conversion nanoparticle. Alternatively, the first photo-conversion particle may include a photo-conversion nanoparticle and the second photo-conversion particle may include a photo-conversion fluorescent material. Also, the first photo-conversion particle and the second photo-conversion particle may include photo-conversion fluorescent materials or include photo-conversion nanoparticles.

In addition, the photo-conversion particle 1100 can convert the wavelength of incident light. For example, the photo-conversion particle 1100 can convert an incident blue light into a green light and/or red light. That is, a portion of the photo-conversion particles 1100 can convert the blue light into a green light that has a wavelength band between about 500 nm and about 599 nm, and another portion of the photo-conversion particles 1100 can convert the blue light into a red light that has a wavelength band between about 600 nm and about 700 nm.

Alternatively, the photo-conversion particle 1100 can convert an incident ultraviolet ray into a blue light, a green light and/or a red light. That is, a portion of the photo-conversion particles 1100 can convert the ultraviolet ray into a blue light that has a wavelength band between about 400 nm and about 499 nm, and another portion of the photo-conversion particles 1100 can convert the ultraviolet ray into a green light that has a wavelength band between about 500 nm and about 599 nm. Also, another portion of the photo-conversion particles 1100 can convert the ultraviolet ray into a red light that has a wavelength band between about 600 nm and about 700 nm.

In addition, the photo-conversion particle 1100 may be a quantum dot (QD). As shown in FIG. 2, the QD may include a core nanocrystal 1110, a shell nanocrystal 1120 that surrounds the core nanocrystal, and a ligand 1130 that is bonded to the shell nanocrystal 1120.

Further, the shell nanocrystal 1120 may be formed of two or more layers and may be formed on the surface of the core nanocrystal 1110. Alternatively, a material that forms the core nanocrystal and a material that forms the shell nanocrystal may also be mixed at the interface between the core nanocrystal and the shell nanocrystal. That is, the interface between the core nanocrystal and the shell nanocrystal may include an alloy of a core nanocrystal material and a shell nanocrystal material.

The QD may include at least one material among a group II compound semiconductor, a group III compound semiconductor, a group V compound semiconductor, and a group VI compound semiconductor. More particularly, the core nanocrystal 1110 and the shell nanocrystal 1120 may be a particle that has a single-layer or multi-layer structure that includes one or more kinds of semiconductor crystals selected from the group consisting of CdS, CdO, CdSe, CdTe, Cd3P2, Cd3As2, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, Hgl2, AgI, AgBr, Al2O3, Al2S3, Al2Se3, Al2Te3, Ga2O3, Ga2S3, Ga2Se3, Ga2Te3, In2O3, In2S3, In2Se3, In2Te3, SiO2, GeO2, SnO2, SnS, SnSe, SnTe, PbO, PbO2, PbS, PbSe, PbTe, AlN, AlP, AlAs, AlSb, GaN, GaP, GaAs, GaSb, GaInP2, InN, InP, InAs, InSb, In2S3, In2Se3, TiO2, BP, Si, Ge, and combinations thereof.

The core nanocrystal 1110 of the photo-conversion particle according to the embodiment include one or more kinds of semiconductor crystals selected from the group consisting of CdS, CdO, CdSe, CdTe, Cd3P2, Cd3As2, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, Hgl2, AgI, AgBr, Al2O3, Al2S3, Al2Se3, Al2Te3, Ga2O3, Ga2S3, Ga2Se3, Ga2Te3, In2O3, In2S3, In2Se3, In2Te3, SiO2, GeO2, SnO2, SnS, SnSe, SnTe, PbO, PbO2, PbS, PbSe, PbTe, AlN, AlP, AlAs, AlSb, GaN, GaP, GaAs, GaSb, GaInP2, InN, InP, InAs, InSb, In2S3, In2Se3, TiO2, BP, Si, Ge, and combinations thereof, and the shell nanocrystal 1120 may include ZnS.

Also, the diameter of the QD can be about 1 nm to 10 nm. Further, the wavelength of light that is emitted from the QD can be adjusted according to the size of the QD. For example, a QD that has a small diameter can convert incident light into light that has a relatively short wavelength band, and a QD that has a large diameter can covert the incident light into light that has a relatively long wavelength band.

The wavelength of the light emitted from the QD can be adjusted according to the size of the QD and the molar ratio of molecular cluster compounds and nanoparticle precursors in a synthesis process. Also, the ligand 1130 is bonded to the QD. For example, at least one of organic ligand and inorganic ligand can be bonded to the QD. Specifically, one end of the ligand 1130 can be bonded to the QD. Also, the ligand 1130 surrounds the QD. More specifically, one end of the ligand 1130 can be bonded to the external surface of the QD so that the ligand surrounds the QD.

Also, the ligand 1130 performs a role in stabilizing unstable QD after synthesis. After synthesis, a dangling bond is formed on the outside of the QD, and due to the dangling bond, the QD may also become unstable. However, since one end of the ligand 1130 is in a non-bonded state and the non-bonded end of the ligand 1130 is bonded to the dangling bond, the QD can be stabilized.

The ligand 1130 may include pyridine, mercapto alcohol, thiol, phosphine or phosphine oxide, or the like. Also, the ligand 1130 may include polyethyleneimine, 3-amino propyltrimethoxy silane, mercaptoacetic acid, 3-mercaptopropyl trimethoxysilane or 3-mercaptopropionic acid or the like.

When the size of the QD is smaller than the Bohr radius of exciton that consists of an electron and a hole that are excited by light, electricity, or the like, a quantum confinement effect occurs, the QD has a discontinuous energy level, and the size of an energy gap varies. Also, since charges are confined in the QD, luminous efficiency is high.

The fluorescent wavelength of such a QD varies according to the size of a particle, unlike a general fluorescent dye. That is, it emits light having a shorter wavelength with a decrease in size of a particle, and it is possible to adjust the size of the particle to emit fluorescence corresponding to a visible ray range having a desired wavelength. Also, since an extinction coefficient is 100 times to 1,000 times higher than a general dye and a quantum yield is also high, the QD generates significantly strong fluorescence.

The protective film 1200 may be disposed to surround the photo-conversion particle 1100. Further, a single or a plurality of photo-conversion particles 1100 can be disposed in the protective film 1200. That is, the protective film 1200 can encapsulate the photo-conversion particle 1100.

Although FIG. 1 shows that the protective film 1200 has a circular shape, the embodiment is not limited thereto and the protective film 1200 may also have a polygonal shape, such as a quadrangle, a triangle, and the like, or another circular shape, such as a semi-spherical shape, a globular shape, an ellipse, and the like.

Further, the protective film 1200 may include a semiconductor crystal. Specifically, the protective film 1200 may include the same or similar material to the shell nanocrystal 1120. For example, the protective film 1200 and the shell nanocrystal 1120 may include at least one of a semiconductor type inorganic material, such as ZnS, CdS, GaN, GaP, AlP, ZnSe, ZnTe or the like and an insulator type inorganic material, such as Al2O2, SiO2, or the like.

Also, the band gaps of the protective film 1200 and the shell nanocrystal 1120 may be different from each other. Specifically, the band gap of the protective film 1200 can be larger than that of the shell nanocrystal 1120. Specifically, the band gap of the protective film 1200 can be greater than that of the shell nanocrystal 1120. Also, the conduction band of the protective film 1200 can be greater than that of the shell nanocrystal 1120.

When the band gap of the protective film 1200 is lower than that of the shell nanocrystal 1120, the energy of the shell nanocrystal 1120 is transferred directly to an inorganic material through the fluorescence resonance energy transfer (FRET) process or energy transfer to the protective film 1200 may occur by the process in which light generated from the shell nanocrystal 1120 is re-absorbed by the protective film 1200.

Also, when the valence electron band of the protective film 1200 is higher than that of the shell nanocrystal 1120, the luminous efficiency of a photo-conversion particle may decrease because a hole generated after light enters the shell nanocrystal 1120 is transferred to the protective film 1200. Also, when the conduction band of the protective film 1200 is lower than that of the shell nanocrystal 1120, the luminous efficiency of a photo-conversion particle may decrease because an electron generated after light enters the shell nanocrystal 1120 is transferred to the protective film 1200.

That is, the protective film 1200 and the shell nanocrystal 1120 may include at least one of a semiconductor type inorganic material, such as ZnS, CdS, GaN, GaP, AlP, ZnSe, ZnTe or the like and an insulator type inorganic material, such as Al2O2, SiO2, or the like in consideration of the sizes of the band gap, the valence electron band and the conduction band. Because the materials of the shell nanocrystal 1120 and the protective film 1200 of the photo-conversion particle are the same, the mismatch of a lattice constant does not occur when the protective film 1200 that is bonded on the surface of the shell nanocrystal 1120 is bonded or grows, and thus it is possible to stably bond the protective film 1200 or enable the protective film to grow.

That is, since the shell nanocrystal 1120 and the protective film 1200 include materials that have the same lattice constant, the protective film 1200 may epitaxially grow and thus it is possible to decrease the surface defect of the protective film 1200. Further, the photo-conversion complex according to the embodiment may include a protective film that is disposed to surround the photo-conversion particle. Thus, the photo-conversion particle may be protected from an external impact. That is, because the photo-conversion particle can prevent moisture and/or oxygen from becoming permeated, due to the protective film, it is possible to enhance the reliability of the photo-conversion complex.

Next, FIG. 3 is a flowchart of a method of fabricating a photo-conversion complex according to an embodiment. Referring to FIG. 3, a reaction solution is provided (ST10), and then a reactant to the reaction solution is added and stirred to form a mixture (ST20). The mixture is then dried (ST30), and grinded (ST40).

Further, a solvent can be provided for dispersing the reactant in step ST10. That is, the reaction solution may include a polar solvent. For example, the reaction solution may include at least one of dimethylformamide, n-methylformamide, dimethyl sulfoxide, ethanol, methanol, ethylene glycol, and ethoxy ethanol.

In step ST20, reactants can be added to the reaction solution. Specifically, the reactants may include a photo-conversion particle, i.e., quantum dot, zinc (Zn) precursor, and sulfur (S) precursor. Further, the quantum dot may include a core nanocrystal, a shell nanocrystal that surrounds the core nanocrystal, and ligand that is connected to the shell nanocrystal.

The core nanocrystal may include one or more kinds of semiconductor crystals selected from the group consisting of CdS, CdO, CdSe, CdTe, Cd3P2, Cd3As2, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, Hg12, AgI, AgBr, Al2O3, Al2S3, Al2Se3, Al2Te3, Ga2O3, Ga2S3, Ga2Se3, Ga2Te3, In2O3, In2S3, In2Se3, In2Te3, SiO2, GeO2, SnO2, SnS, SnSe, SnTe, PbO, PbO2, PbS, PbSe, PbTe, AlN, AlP, AlAs, AlSb, GaN, GaP, GaAs, GaSb, GaInP2, InN, InP, InAs, InSb, In2S3, In2Se3, TiO2, BP, Si, Ge, and combinations thereof.

In addition, the shell nanocrystal may include at least one of a semiconductor type inorganic material, such as ZnS, CdS, GaN, GaP, AlP, ZnSe, ZnTe or the like and an insulator type inorganic material, such as Al2O3, SiO2, or the like. Also, the ligand may include organic ligand or inorganic ligand. That is, the quantum dot may be connected to the ligand that has polarity, in order to be dispersed in the reaction solution that has polarity. Specifically, the ligand may include sodium sulfide (Na2S). That is, the surface of the quantum dot may have S2-group by the ligand.

The Zn precursor may include a precursor for generating Zn2+ ion. Specifically, the zinc (Zn) precursor may include the precursor of at least one of zinc perchlorate, zinc sulfonate, zinc chloride, and zinc acetate. The sulfur (S) precursor may include a precursor for generating S2- ion. Specifically, the sulfur (S) precursor may include sodium sulfide (Na2S).

In addition, the quantum dot, the zinc (Zn) precursor, and the sulfur (S) precursor can be added to the reaction solution that has polarity. Subsequently, the reactants can be mixed in reaction solution through an agitator. For example, as the zinc (Zn) precursor, about 5 wt % to about 20 wt % zinc sulfate heptahydrate can be added to about 2 mL water or polar organic solvent, and as the sulfur (S) precursor, about 5 wt % to about 20 wt % sodium sulfide nonahydrate can be added to about 2 mL water or polar organic solvent. Also, about 0.1 wt % to about 7 wt % quantum dot is included.

Further, is possible to mix the quantum dot, the zinc precursor, and the sulfur precursor to add the mixture to about 10 mL to about 50 mL water to form a mixture. In this instance, in order to accelerate the precipitation reaction of the mixture that is generated by the mixing of the reactants, a solvent, such as water can be added to the reaction solution.

Subsequently, in step ST30 the solvent is removed. In particular, the drying process can be performed at a temperature of about 200° C. to about 500° C. for about 24 hours in a vacuum state. For example, the drying process can be performed at a temperature of about 200° C. to about 500° C. for about 24 hours by using a vacuum oven.

Subsequently, in step ST40, the dried mixture can be grinded to fabricate a photo-conversion complex including powder that has a certain size. The photo-conversion complex may be divided into a plurality of photo-conversion complexes by the grinding process. Further, the photo-conversion complex may be fabricated to have various shapes according to a grinding method. The grinding process may be performed through a dry-type mechanical grinder. As an example, the grinding process may be performed by grinder and ball-mill processes.

In addition, a photo-conversion member to which a photo-conversion complex according to an embodiment is applied is described below with reference to FIGS. 4 to 6. In describing the photo-conversion member according to an embodiment, the same or similar content to the above-described photo-conversion complex is omitted. That is, except for altered parts, descriptions on the photo-conversion complex as described earlier may be applied to the present embodiment.

Figure 4:
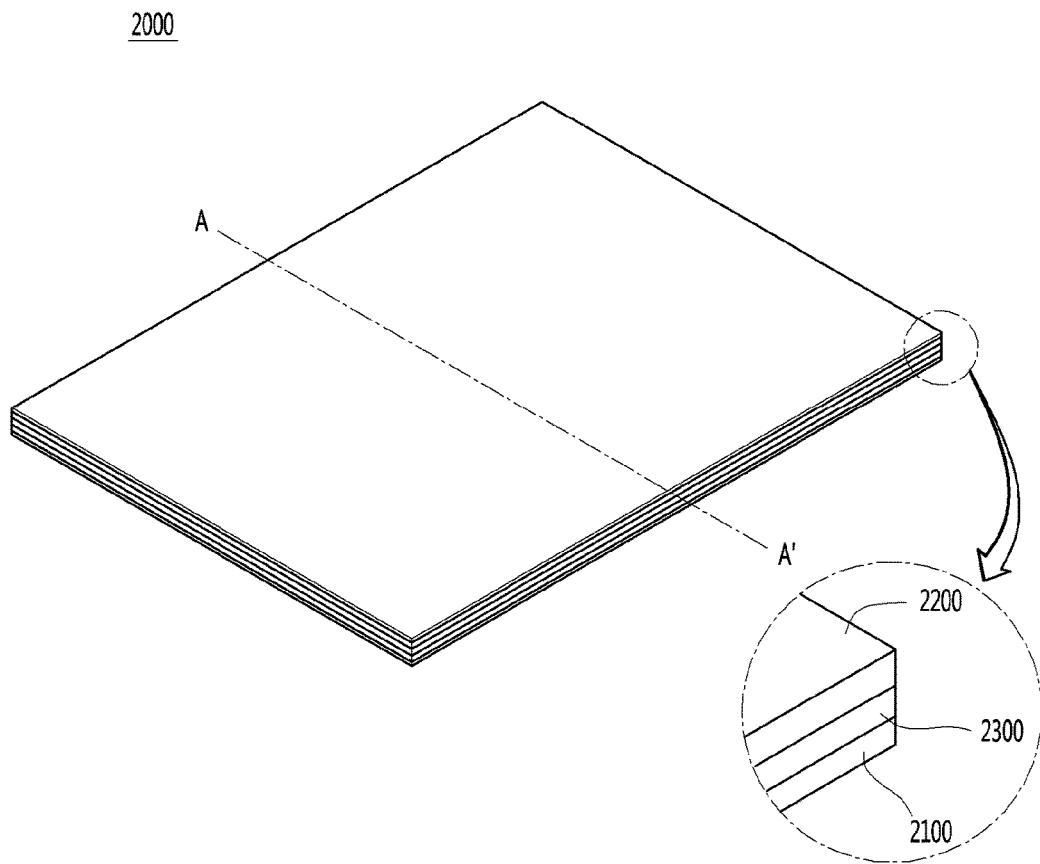
FIG. 4 is a perspective view of a photo-conversion member to which a photo-conversion complex according to an embodiment is applied.
Figure 5:
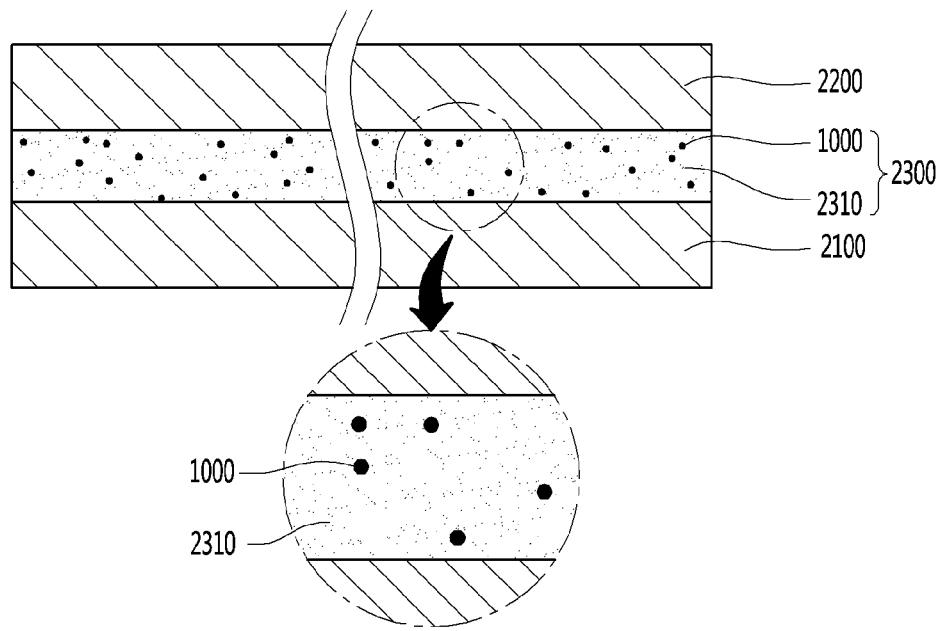
FIG. 5 is a cross-sectional view taken along line A-A' in FIG. 4.

Referring to FIGS. 4 and 5, a photo-conversion member 2000 according to an embodiment may include a lower substrate 2100, an upper substrate 2200, and a photo-conversion layer 2300. As shown, the lower substrate 2100 is disposed under the photo-conversion layer 2300. The lower substrate 2100 may be transparent and flexible. Further, the lower substrate 2100 may be in close contact with the bottom surface of the photo-conversion layer 2300.

An example of a material that is used for the lower substrate 2100 may include a transparent polymer, such as polyethyleneterephthalate (PET). In addition, the upper substrate 2200 is disposed on the photo-conversion layer 2300 and may be transparent and flexible. In addition, the upper substrate 2200 may be in close contact with the top surface of the photo-conversion layer 2300. An example of a material that is used for the upper substrate 2200 may include a transparent polymer, such as polyethyleneterephthalate (PET).

Further, the lower substrate 2100 and the upper substrate 2200 may be disposed on one surface of the photo-conversion layer 2300 and the other surface thereof. That is, the photo-conversion layer 2300 can be disposed between the lower substrate 2100 and the upper substrate 2200. In addition, the lower substrate 2100 and the upper substrate 2200 support the photo-conversion layer 2300 and protect the photo-conversion layer 2300 from an external physical impact. The lower substrate 2100 and the upper substrate 2200 may also be in direct contact with the photo-conversion layer 2300.

Also, the lower substrate 2100 and the upper substrate 2200 preferably have low oxygen transmission rate and moisture permeability. Thus, the lower substrate 2100 and the upper substrate 2200 can protect the photo-conversion layer 2300 from an external chemical impact, such as moisture and/or oxygen.

In addition, the photo-conversion layer 2300 can be interposed between the lower substrate 2100 and the upper substrate 2200 and be in close contact with the top surface of the lower substrate 2100 and in close contact with the bottom surface of the upper substrate 2200.

Further, the photo-conversion layer 2300 may include a matrix 2310 and a plurality of photo-conversion complexes 1000. The photo-conversion complex 1000 may include the photo-conversion complex according to the above-described embodiment. The matrix 2310 surrounds the photo-conversion complex 1000. That is, the photo-conversion complexes 1000 can be uniformly dispersed in the matrix 2310. The matrix 2310 may be made up of a polymer, such as a silicon resin and be transparent. That is, the matrix 2310 may be formed of a transparent polymer.

In addition, the matrix 2310 may be disposed between the lower substrate 2100 and the upper substrate 2200. The matrix 2310 may also be in close contact with the top surface of the lower substrate 2100 and the bottom surface of the upper substrate 2200. The photo-conversion particles 1000 can be disposed between the lower substrate 2100 and the upper substrate 2200. Specifically, the photo-conversion particles 1000 can be uniformly dispersed in the matrix 2310 and the matrix 2310 can be disposed between the lower substrate 2100 and the upper substrate 2200.

In addition, the photo-conversion complexes 1000 can convert the wavelength of the light output from a light source and receive the light output from the light source to convert the wavelength of the received light.

In addition, scattering particles may be further disposed in the matrix 2310. The scattering particles may be transparent and include an inorganic material. More specifically, an example of a material used as the scattering particles includes an oxide, such as silicon oxide or the like. For example, silica particles may be used as the scattering particles.

Further, the scattering particles may be an organic light scattering agent, an inorganic light scattering agent or combinations thereof. A particular example of the inorganic light scattering agent may include a particle that includes silicon (Si), silica, alumina, titanium dioxide (TiO2), zirconia (ZrO2), barium sulfate, zinc oxide (ZnO), and combinations thereof, and a particle example of the organic light scattering agent may include a polymer particle that includes a polymethylmethacrylate (PMMA) polymer, benzoguanamine polymer or a combination thereof. The inorganic light scattering agent and the organic light scattering agent may be used independently or mixed and it is also possible to mix and use two or more kinds of light scattering agents that are different in size.

For example, a micro-light scattering agent having a diameter of 0.5 μm to 10 μm, a nanolight scattering agent having a diameter of 5 nm to 200 nm or a combination thereof may be used as the light scattering agent. The scattering particles perform a scattering function that alters the path of incident light. Also, dispersion enhancement particles may be further disposed in the matrix 2310. For example, the dispersion enhancement particles include sodium stearate (SDS), Tween-60, Tween-80, Triton X-100, CTAB or the like but the embodiment is not limited thereto.

Next, a display device 3000 to which a photo-conversion complex according to an embodiment is applied is described below with reference to FIGS. 6 to 7. In describing the display device according to an embodiment, the same or similar content to the above-described photo-conversion complex is omitted. That is, except for altered parts, descriptions on the photo-conversion complex as described earlier may be essentially applied to the present embodiment.

As shown, the display device 3000 includes a backlight unit 3100 and a liquid crystal panel 3200. The backlight unit 3100 emits light to the liquid crystal panel 3200 and can uniformly emit light to the bottom surface of the liquid crystal panel 3200 with a plane light source.

Further, the backlight unit 3100 is disposed under the liquid crystal panel 3200 and includes a bottom cover 3110, a printed circuit board (PCB) 3120, a light source 3130, a reflective member 3140, and a photo-conversion member 2000. The bottom cover 3110 may have an open top shape and specifically, the bottom cover 3110 may have a closed bottom end and an open top. In addition, the bottom cover 3110 receives the PCB 3120, the light source 3130, the reflective member 3140, and the photo-conversion member 2000.

That is, the PCB 3120 is received in the bottom cover 3110. Further, the PCB 3120 may be disposed at the inner side of the bottom cover 3110. For example, the PCB 3120 may be disposed to be in direct or indirect contact with at least one surface of the bottom cover 3110. In addition, the light source 3130 can be mounted on the PCB 3120. Also, the PCB 3120 may be rigid or flexible.

Further, the light source 3130 can generate light toward the liquid crystal panel 3200. Specifically, the light source 3130 includes a plurality of light-emitting diodes (LED) and may be a blue LED that generates a blue color or an UV LED that generates an ultraviolet ray. That is, the light source 3130 can generate a blue light that has a wavelength band between about 430 nm and about 470 nm, or an ultraviolet ray that has a wavelength band between about 300 nm and about 400 nm.

In addition, the light source 3130 may be mounted on the PCB 3120. For example, the PCB 3120 and the light source 3130 can be electrically connected, and the light source 3130 receives a driving signal through the PCB 3120 and is thus driven. The light source 3130, i.e., the plurality of LEDs may be mounted on the PCB 3120 at intervals. For example, the plurality of LEDs may be mounted and disposed on the PCB 3120 at regular or irregular intervals.

Further, the reflective member 3140 may be disposed on the PCB 3120. Specifically, a first reflective member 3141 and a second reflective member 3142 may be disposed on the PCB 3120. For example, the first reflective member 3141 can be disposed on the PCB 3120, and the second reflective member 3142 can be disposed on the first reflective member 3141.

The first reflective member 3141 may be a reflective sheet. Also, the first reflective member 3141 may have a hole in a region thereof corresponding to a region in which the light source 3130 mounted on the PCB 3120 is disposed. Thus, the first reflective member 3141 can disposed on only regions of the PCB 3120 on which the light source 3130 is not disposed.

Further, the first reflective member 3141 is disposed on the PCB 3120 for reflecting light emitted from the light source 3130 toward the second reflective member 3142 to reflect the light back to the liquid crystal panel 3200. In addition, the second reflective member 3142 can be disposed at an interval from the first reflective member 3141. Specifically, the first reflective member 3141 and the second reflective member 3142 can be disposed at an interval from each other, and the light source 3130 can be disposed between the first reflective member 3141 and the second reflective member 3142.

A spacer 3145 can be disposed between the first reflective member 3141 and the second reflective member 3142 to control the distance between the first reflective member 3141 and the second reflective member 3142. Further, the second reflective member 3142 includes an opening 3142*a* and a closed portion 3142*b*. Specifically, the second reflective member 3142 may include the opening 3141*a* through which the light emitted from the light source 3130 can pass, and the closed portion 3142*b*.

In addition, the opening 3142*a* and the closed portion 3142*b* may be alternately disposed. Specifically, the second reflective member 3142 may include a plurality of openings 3142*a* and a plurality of closed portions 3142*b*, and the openings 3142*a* and the closed portions 3142*b* can be alternately disposed. That is, the closed portion 3142*b* can be disposed between the openings 3142*a* and the opening 3142*a* can be disposed between the closed portions 3142*b*.

The openings 3142*a* and the closed portions 3142*b* may be different in size. The sizes of the plurality of the openings 3142*a* may also be different from each other. Further, the sizes of the plurality of the closed portions 3142*b* may different from each other. For example, the sizes of the plurality of closed portions 3142*b* can be gradually larger away from the light source 3130.

In addition, the second reflective member 3142 enhances the luminance of the display device. Specifically, the light emitted from the light source 3130 has different intensities in a region in which the light source 3130 is disposed and a region in which the light source 3130 is not disposed, and thus the luminance is non-uniform in the region in which the light source is disposed and in the region in which the light source is not disposed.

Thus, the second reflective member 3142 can be disposed on the PCB 3120, i.e., the light source 3130 so that the light emitted from the light source 3130 is emitted upwards through reflecting by the first reflective member 3141 and the second reflective member 3142. Thus, since it is possible to make amounts of light uniform in the region in which the light source 3130 is disposed and in the region in which the light source is not disposed, it is possible to make the entire luminance uniform.

Further, the photo-conversion member 2000 may be disposed on the reflective member 3140. Specifically, the photo-conversion member 2000 may be disposed on the second reflective member 3142. The photo-conversion member 2000 may be the same as the photo-conversion member according to the above-described embodiment.

Optical sheets, such as a diffusion member 3150, a condensing film 3160 or the like may be further included on and/or under the photo-conversion member 2000 as needed. In this instance, the diffusion member 3150 and the condensing film 3160 diffuse and condense the light that has passed through the second reflective member 3412 to be emitted to the outside, improve the luminance distribution of the backlight unit, and enhance the luminance.

Figure 6:
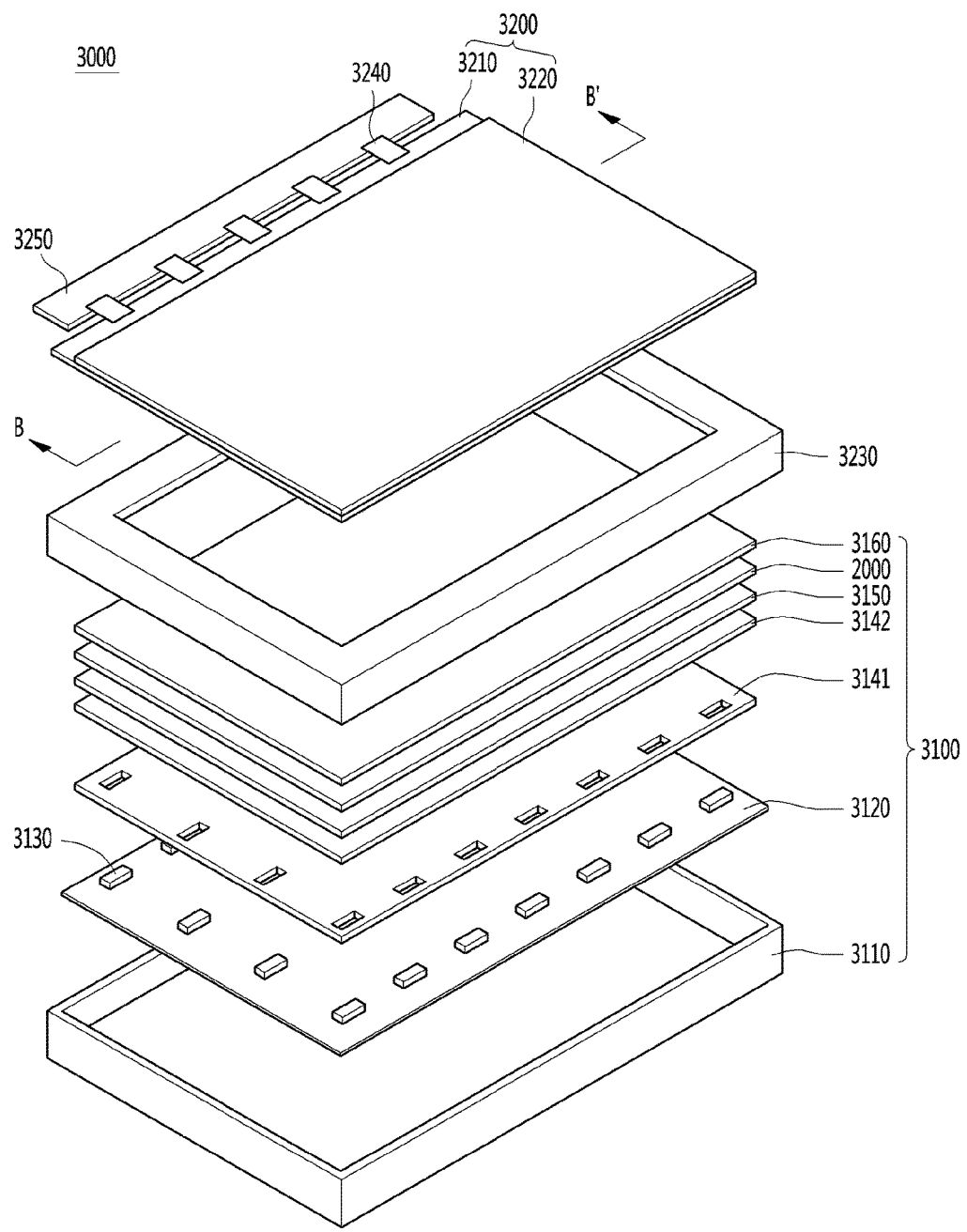
FIG. 6 is a perspective view of a display device to which a photo-conversion member according to an embodiment is applied.
Figure 7:
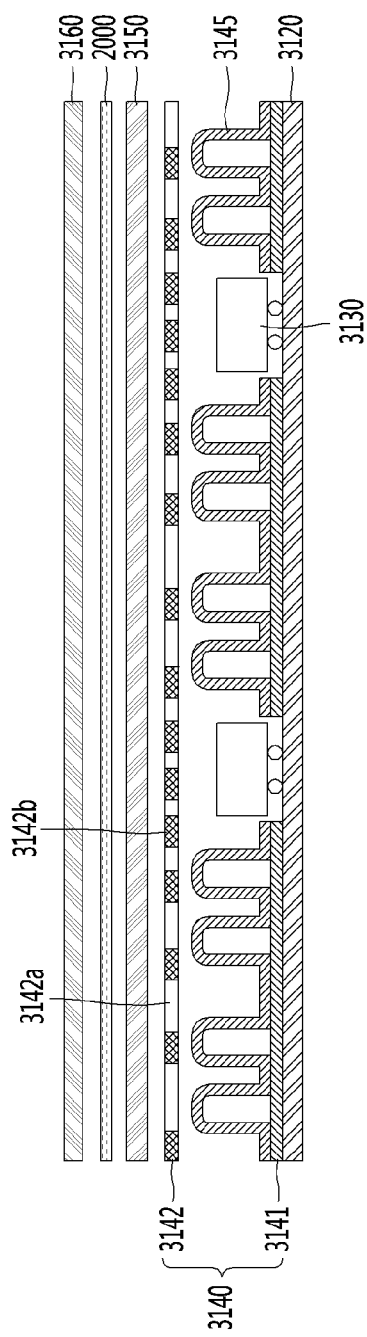
FIG. 7 is a cross-sectional view taken along arrow B-B' in FIG. 6.

Although FIGS. 6 and 7 show that the diffusion member 3150 is disposed under the photo-conversion member 2000 and the condensing film 3160 is disposed on the photo-conversion member 2000, the embodiment is not limited thereto. For example, both the diffusion member and the condensing film can be disposed on the photo-conversion member 2000. Also, although FIGS. 6 and 7 show that there are one diffusion member and one condensing film, the embodiment is not limited thereto and one or more diffusion members and condensing films may be used. A prism sheet, a lenticular sheet, DBEF, or the like may also be used as the condensing film.

Figure 8:
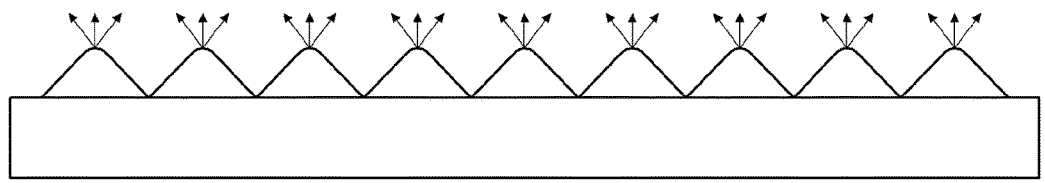
FIG. 8 is a diagram showing an example of a round prism film according to an embodiment.

Further, as the condensing film, a round prism film can be used as shown in FIG. 8. In more detail, the round prism film is obtained by the rounding of the right angle portion of a prism film, and when it is used, light is diffused from the right angle portion of the prism film and thus it is possible to obtain improved chrominance than when the prism film is used.

In addition, the liquid crystal panel 3200 may be disposed on the optical sheets. Also, the liquid crystal panel 3200 may be disposed on a panel guide 3230 and be guided by the panel guide 3230. The liquid crystal panel 3200 can also adjust the intensity of transmitted light to display an image. That is, the liquid crystal panel 3200 uses the light emitted from the backlight unit 3100 to display an image. Further, as shown in FIG. 6, the liquid crystal panel 3200 includes a TFT substrate 3210, a color filter substrate 3220, and a liquid crystal layer interposed between the two substrates. Also, the liquid crystal panel 3220 may include polarizing filters.

Further, FIGS. 6 to 8 do not show in detail the TFT substrate 3210 and the color filter substrate 3220, but the TFT substrate 21 define pixels by the intersecting of a plurality of gate lines and a plurality of data lines and a thin film transistor TFT is disposed at each intersection region to be capable of being one-to-one connected to a pixel electrode mounted on each pixel. The color filter substrate 3220 may include R, B, and B color filters corresponding to each pixel, a black matrix that surrounds the color filters and covers the gate line, data line, and the TFT, and a common electrode that covers them all.

Also, a driving PCB 3250 that supplies driving signals to the gate line and the data line can be disposed at the edge of the liquid crystal panel 3200. In more detail, the driving PCB 3250 can be electrically connected to the liquid crystal panel 3200 by a chip on film (COF) 3240. In this example, the COF 3240 may be altered to a tap carrier package (TCP).

Another display device to which a photo-conversion complex according to an embodiment is applied is described below with reference to FIG. 9. In describing this other display device, the same or similar content to the display device as described earlier is omitted and the same components are assigned the same reference numerals.

Figure 9:
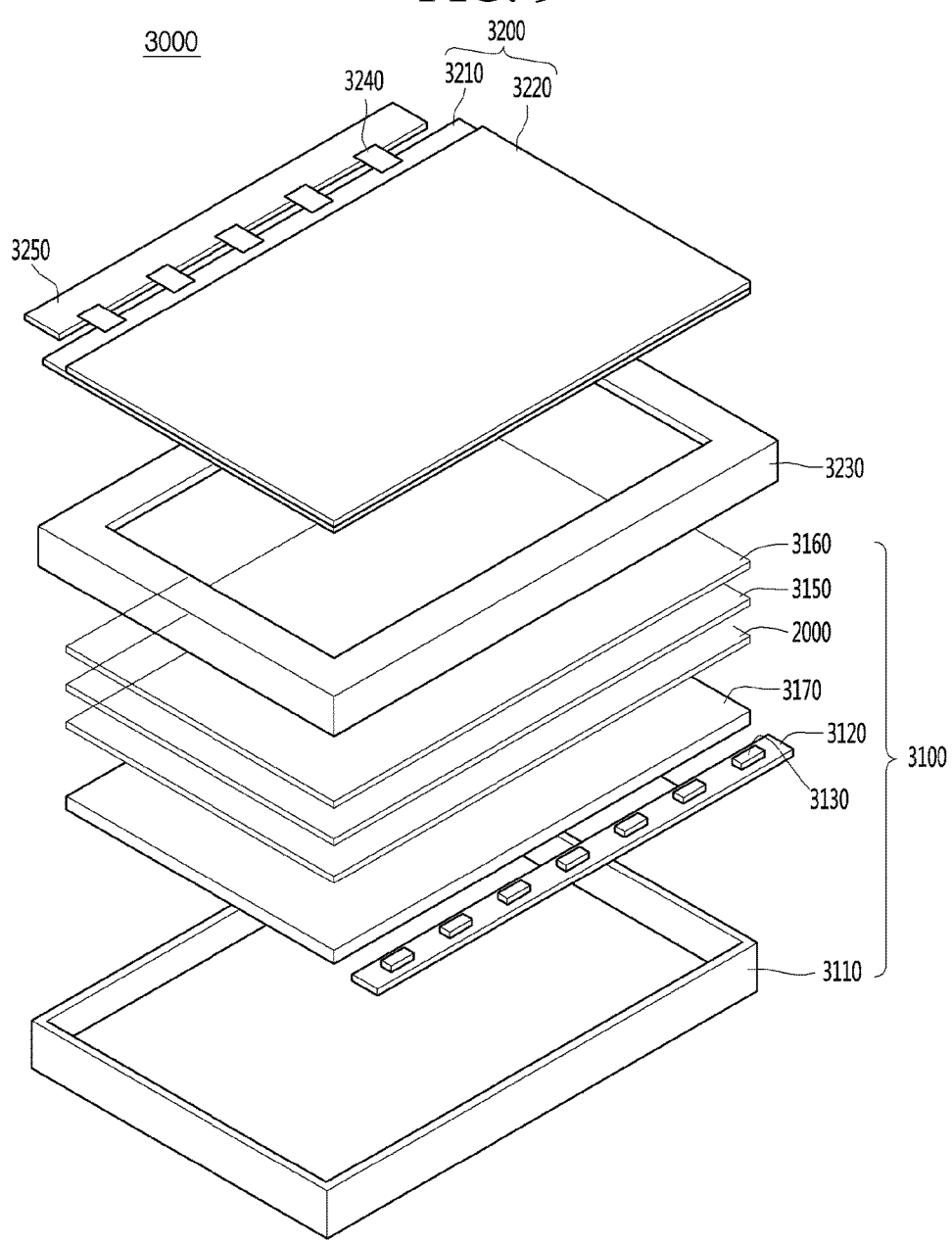
FIG. 9 is a perspective view of a display device to which a photo-conversion member according to an embodiment is applied.

Referring to FIG. 9, the other display device 3000 includes a light guide plate 3170, unlike the display device as described earlier. In more detail, the light guide plate 3170 is disposed in the bottom cover 3110 and on the reflective member 3140. The light guide plate 3170 emits light that is emitted from the light source 3130, upwards through total reflection, refraction and scattering.

Further, the reflective member 3140 is disposed under the light guide plate 3170. More specifically, the reflective member 3140 is disposed between the light guide plate 3170 and the bottom surface of the bottom cover 3110. The reflective member 3140 reflects the light upwards that is emitted from the lower surface of the light guide plate 3170.

Also, the light source 3130 is disposed at a side of the light guide plate 3170 and can generate light to enable the light to enter the light guide plate 3170 through a side of the light guide plate 3170. Further, the photo-conversion member 2000 that includes the photo-conversion complex as described earlier is disposed on the light guide plate 3170.

Also, the diffusion member 3150, the condensing film 3160, or the like may be disposed on the photo-conversion member 200. Further, the liquid crystal panel 3200 is disposed on the condensing film 3160. The liquid crystal panel 3200 may also be disposed on the panel guide 3230 and be guided by the panel guide 3230.

Since the liquid crystal panel 3200 is the same or similar as the display panel as described in FIG. 6, related descriptions are omitted below. Next, a light-emitting device package to which a photo-conversion complex according to an embodiment is applied is described below with reference to FIGS. 10 and 11. In describing the light-emitting device package according to an embodiment, the same or similar content to the above-described photo-conversion complex is omitted. That is, except for altered parts, descriptions on the photo-conversion complex as described earlier may be essentially applied to the present embodiment.

Figure 10:
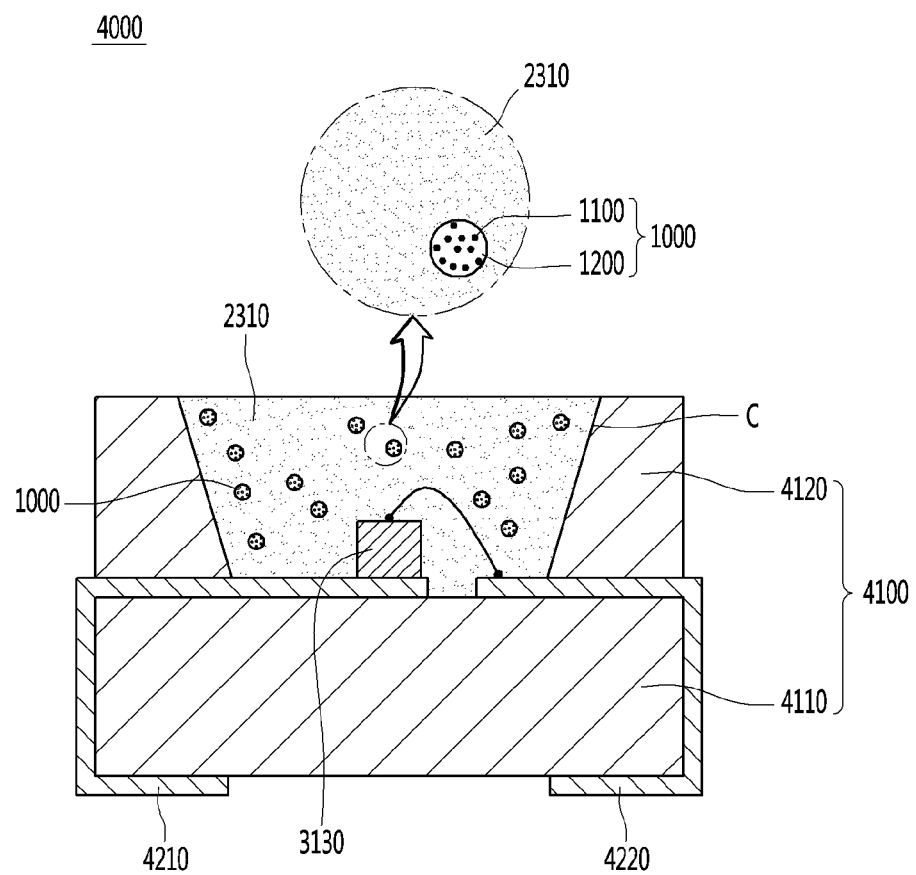
FIG. 10 is a cross-sectional view of a light-emitting device package to which a photo-conversion complex according to an embodiment is applied.
Figure 11:
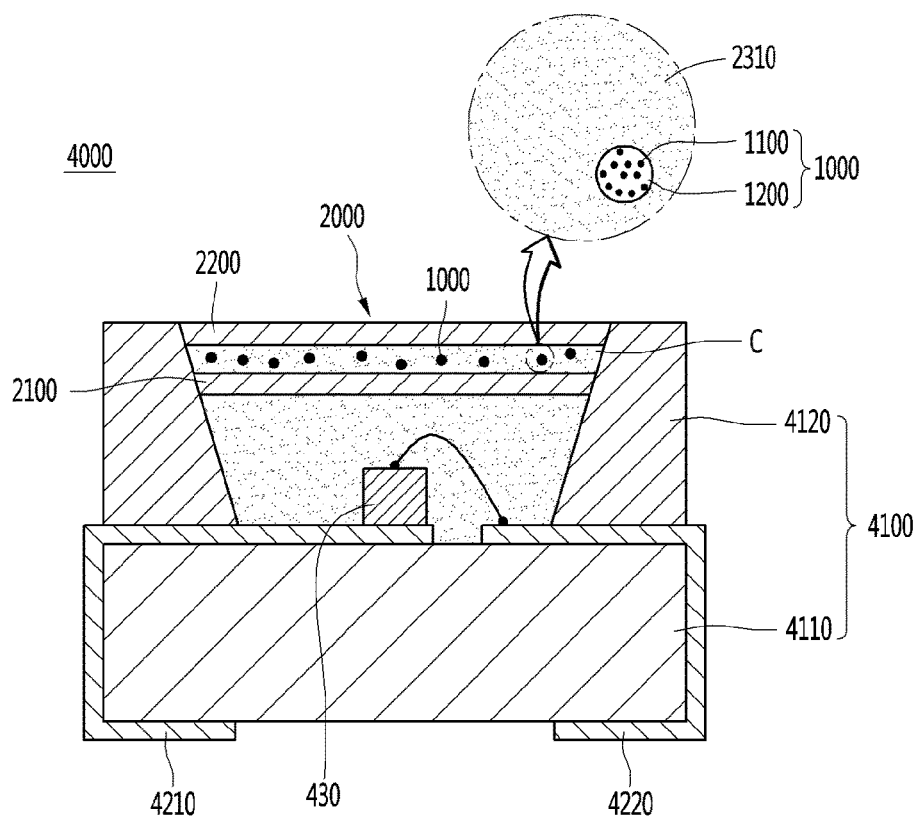
FIG. 11 is another cross-sectional view of a light-emitting device package to which a photo-conversion complex according to an embodiment is applied.

Referring to FIGS. 10 and 11, a light-emitting diode (LED) package 4000 according the embodiment includes a body portion 4100, a plurality of lead electrodes 4210 and 4220, a light source 3130, a matrix 2310, and a plurality of photo-conversion complexes 1000. The body portion 4100 receives the light source 3130, the matrix 2310 and the photo-conversion complexes 1000, and supports the lead electrodes 4210 and 4220.

Further, the material of the body portion 4100 may include any one of e.g., a resin material, such as PPA, a ceramic material, a liquid crystal polymer (LCP), syndiotactic (SPS), poly (phenylene ether) (PPS), a silicon material. However, the material of the body portion 4100 is not limited thereto. The body portion 4100 may also be formed integrally by injection molding or may be formed in a structure in which a plurality of layers is stacked.

In addition, the body portion 4100 may include a cavity C that has an open top. The cavity C may be formed by a patterning, punching, cutting or etching process on the body portion 4100. Also, the cavity C may be formed by a metal frame that follows the shape of the cavity C, when the body portion 4100 is molded.

The shape of the cavity C may be a cup shape, a concave container shape, or the like, and the surface of the cavity may be a circular shape, a polygonal shape, a random shape or the like and is not limited thereto. The inner surface of the cavity C may be formed to be perpendicular to or at an angle from the bottom surface of the cavity C in consideration of the light distribution angle of the LED package.

The body portion 4100 includes a base portion 4110 and a receiving portion 4120. The base portion 4110 supports the receiving portion 4120 and the lead electrodes 4210 and 4220. Further, the base portion 4110 may have e.g., a rectangular parallelepiped shape.

The receiving portion 4120 is disposed on the base portion 4110, and the cavity C is defined by the receiving portion 4120. That is, the cavity C may be a groove that is formed in the receiving portion 4120. Thus, as shown, the receiving portion 4120 surrounds the cavity C. Further, when viewed from the top, the receiving portion 4120 may have a closed loop shape. For example, the receiving portion 4120 may have a wall shape that surrounds the cavity C.

In addition, the receiving portion 4120 includes a top surface, an outer surface and an inner surface. As shown, the inner surface may be an inclined slope relative to the top surface. Further, the lead electrodes may be implemented as lead frames and the embodiment is not limited thereto.

The lead electrodes 4210 and 4220 are also disposed in the body portion 4100, and can be disposed on the bottom surface of the cavity C to be electrically disconnected. Further, the outer portions of the lead electrodes 4210 and 4220 are exposed outside the body portion 4100.

The ends of the lead electrodes 4210 and 4220 may be disposed at one side of the cavity C or at an opposite side to the cavity C. The lead electrodes 4210 and 4220 may also be formed as lead frames, and the lead frame may be formed upon injection molding of the body portion 4100. Further, the lead electrodes 4210 and 4220 may be e.g., a first lead electrode 4210 and a second lead electrode 4220.

In addition, the first lead electrode 4210 and the second lead electrode 4220 may be disposed at an interval and be electrically connected to the light source 3130. Further, the light source 3130 may include at least one LED chip.

For example, the light source 3130 may be a horizontal LED or vertical LED chip and be connected to the first lead electrode 4210 by a bump or the like and to the second lead electrode 4220 by a wire. As shown, the light source 3130 is disposed directly on the first lead electrode 4210 and may be connected to the lead electrodes 4210 and 4220 by wire bonding, die bonding, or flip bonding or the like without a limitation to such connection techniques.

Further, the matrix 2310 is formed in the cavity C. That is, the matrix 2310 is filled in the cavity. The matrix 2310 may also be transparent and include a light transmission material. The matrix 2310 also covers the light source 3130 and may be in direct contact with the light source 3130.

Also, a reflective layer may be formed on the inner surface of the cavity C. In more detail, the reflective layer may include a material having high reflectance, e.g., white photo solder resist (PSR) ink, silver (Ag), aluminum (Al) or the like. Further, the photo-conversion complexes 1000 may be disposed on the path of light emitted from the light source 3130. For example, the photo-conversion complexes 1000 are disposed in the cavity C and may be disposed adjacent to the light source 3130. The photo-conversion complexes 1000 are disposed in the matrix 2310. More specifically, the photo-conversion complexes 1000 may be uniformly dispersed in the matrix 2310. Thus, a portion or whole of the light emitted from the light source 3130 enters the photo-conversion complexes 1000.

That is, the photo-conversion complexes 1000 can convert a blue light emitted from the light source 3130 into a green light and/or red light. More specifically, the photo-conversion complexes 1000 can convert a blue light from the light source 3130 into light that has a wavelength band between about 500 nm and about 599 nm, and/or light that has a wavelength band between about 600 nm and about 700 nm. Thus, it is possible to produce white light by the light converted and not converted by the photo-conversion complexes 1000. That is, white light is emitted by a combination of the blue light, the green light and the red light.

Referring to FIG. 11, the photo-conversion complex 1000 can also be applied to the surface of a filling portion by using a sheet form, i.e., layer structure. That is, the photo-conversion member 2000 as described earlier may be disposed on the LED package. Thus, it is possible to produce white light by the light converted and not converted by the photo-conversion complexes 30. That is, white light can be emitted by a combination of the blue light, the green light and the red light. As described earlier, the LED package according the embodiment uses the photo-conversion complexes 1000 to have enhanced reliability and durability.

The present disclosure is described below in more detail according to embodiments and comparative examples. These embodiments are only examples illustrating the present disclosure in more detail. Thus, the present disclosure is not limited these embodiments.

Embodiment 1

N-methylformamide is provided as a reaction solvent in a reaction container and then a quantum dot, a sulfide (S) precursor, and a zinc (Zn) precursor are added to the reaction solvent. In this instance, the quantum dot may include oleic acid capped InP/ZnSeS, and surface ligand may be replaced to have S-2 group by using sodium sulfide (Na2S).

Also, about 10 mg/ml quantum dot is added to 1 ml n-methylformamide solution to make reaction solvent 1. Also, about 5 wt % sodium sulfide (Na2S) as the zinc precursor is added to 2 ml n-methylformamide solution to make reaction solvent 2. About 20 wt % zinc sulfate (ZnSO4) as the sulfide precursor is added to 2 ml n-methylformamide solution to make reaction solvent 3.

Subsequently, the reaction solvents 1 to 3 are mixed, about 15 ml water is added thereto, and they are stirred so that the reaction solvents 1 to 3 are mixed. Subsequently, the mixture is dried at a temperature of about 200° C. for about 24 hours, and then it is further dried at a temperature of about 500° C. for about an hour to remove the solvents and obtain a precipitate.

Subsequently, the precipitate is ground with a grinding device to fabricate a photo-conversion complex that includes a quantum dot. Subsequently, a mixture obtained by the mixing of the photo-conversion complex and a photo-curable resin is coated on a lower substrate that includes polyethyleneterephthalate (PET). The photo-curable resin is a mixture of BPA diacrylate and trimethylolpropane trimethacrylate (TMPTMA) and used along with a photo initiator. In this instance, about 0.5 wt % to about 20 wt % photo-converting complex is included with respect to the photo-curable resin.

Subsequently, after an upper substrate that includes polyethyleneterephthalate (PET) is disposed on the photo-conversion complex to fabricate a photo-conversion member, the storage reliability of the photo-conversion complex is observed at room temperature. Also, the photo-conversion complex has been observed by using a transmission electron microscope (TEM).

Embodiment 2

After the photo-conversion complex is fabricated to fabricate the photo-conversion member in the same manner as Embodiment 1, storage reliability is observed at a temperature of about 60° C. and at a humidity of about 90%, and the photo-conversion complex is observed by the using of a TEM.

Comparative Example 1

After a quantum dot layer that includes an oleic acid capped InP/ZnSeS quantum dot is coated on a lower substrate and an upper substrate is disposed on the quantum dot layer to fabricate a photo-conversion member, the storage reliability of the quantum dot is observed at room temperature and the quantum dot is observed by the using of a TEM.

Comparative Example 2

After a quantum dot layer that includes an oleic acid capped InP/ZnSeS quantum dot is coated on a lower substrate and an upper substrate is disposed on the quantum dot layer to fabricate a photo-conversion member, the storage reliability of the quantum dot is observed at a temperature of about 60° C. and at a humidity of about 90% and the quantum dot is observed by using a TEM.

Figure 12:
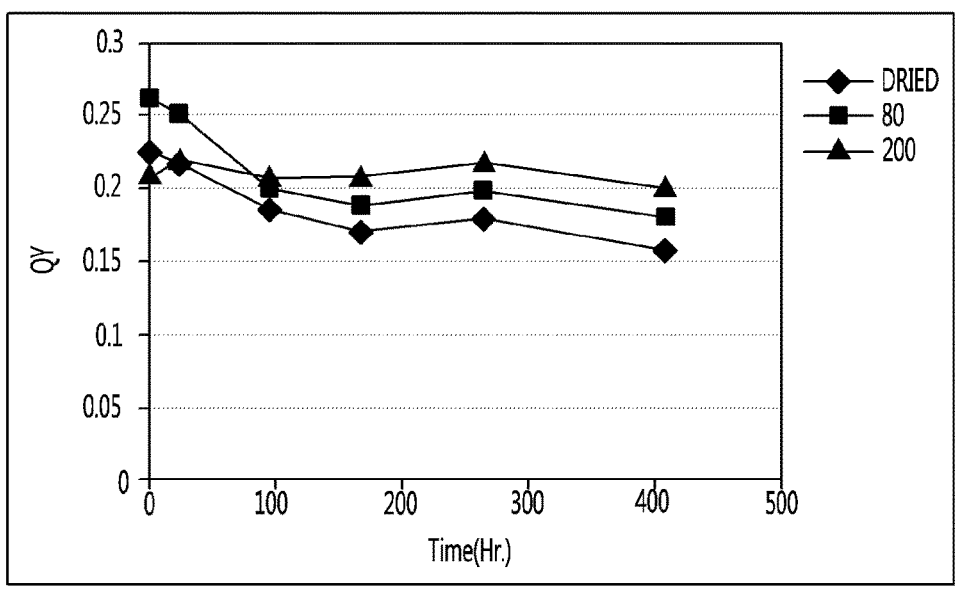
FIGS. 12 to 15 are graphs illustrating the reliability test of a photo-conversion complex according to embodiments.
Figure 13:
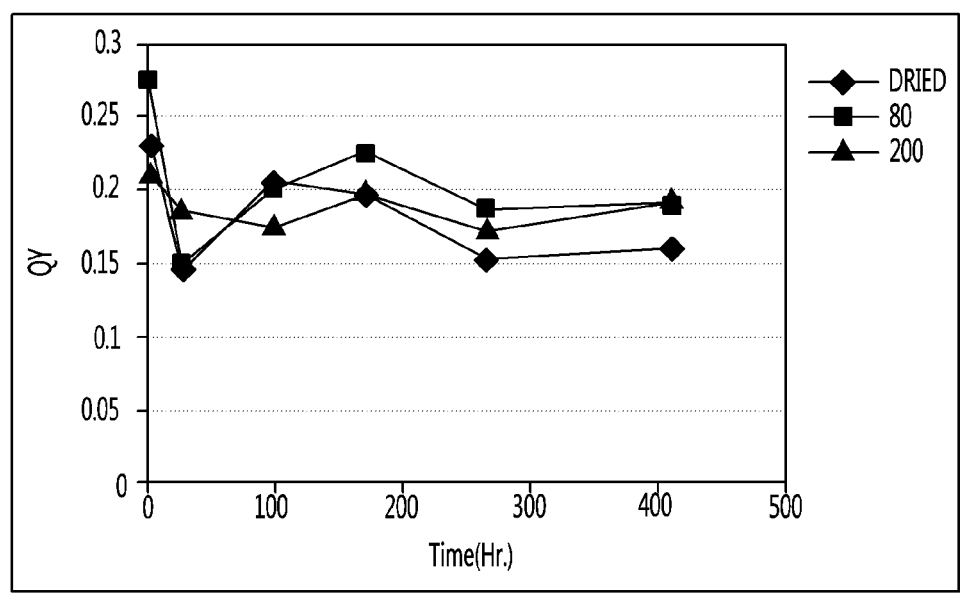
Figure 14:
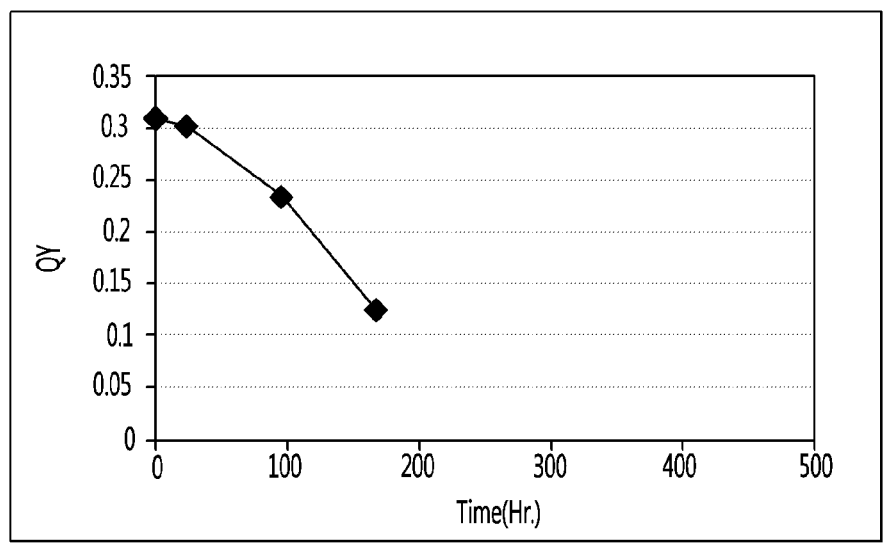
Figure 15:
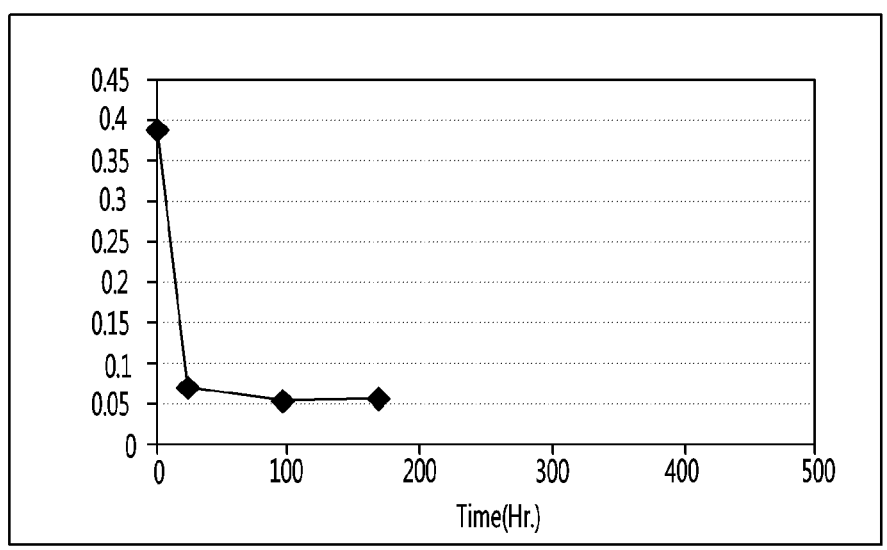

Referring to FIGS. 12 and 13, it can be seen that the photo-conversion complexes in Embodiments 1 and 2 have stable storage reliability at room temperature, at a temperature of about 60° C., and at a humidity of about 90%. However, referring to FIGS. 14 and 15, it can be seen that the reliability of the quantum dots in Comparative examples 1 and 2 decreases at room temperature, at a temperature of about 60° C., and at a humidity of about 90% over time.

That is, the photo-conversion complex according to Embodiments 1 and 2 have enhanced reliability, because the protective film surrounding the quantum dot, i.e., zinc sulfide (ZnS) protects the quantum dot from external moisture or oxygen. Also, when observing the photo-conversion complexes in Embodiments 1 and 2 by using a TEM, the interface between a shell structure and the protective film is found, but it was not possible to find the interface other than the shell structure in Comparative examples 1 and 2.

The photo-conversion complex according to the embodiment includes the protective film surrounding the photo-conversion particle. Thus, the photo-conversion particle is protected from an external impact. That is, since the photo-conversion particle prevent moistures and/or oxygen from becoming permeated, due to the protective film, the reliability of the photo-conversion complex is improved. Also, the process efficiency is enhanced because a separate barrier layer and/or sealing layer is not needed when fabricating the photo-conversion member that includes the photo-conversion complex.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A photo-conversion complex comprising:
    a plurality of first and second photo-conversion particles, each including a core nanocrystal, a shell nanocrystal surrounding the core nanocrystal, and a ligand bonded to the shell nanocrystal, the plurality of first photo-conversion particles converting first color light into a second color light and the plurality of second photo-conversion particles converting the first color light into a third color light; and
    a protective film surrounding the plurality of first and second photo-conversion particles,
    wherein the protective film has a band gap greater than a band gap of the shell nanocrystal, and
    wherein the protective film and the shell nanocrystal includes materials that have the same lattice constant.

2. The photo-conversion complex according to claim 1, wherein the shell nanocrystal and the protective film include a same material.

3. The photo-conversion complex according to claim 1, wherein at least one of the shell nanocrystal and the protective film includes zinc sulfide (ZnS).

4. The photo-conversion complex according to claim 1, wherein the ligand comprises at least one of organic ligand and inorganic ligand.

5. The photo-conversion complex according to claim 1, wherein the first and second photo-conversion particles each comprises a quantum dot, and
    wherein the protective film includes zinc sulfide (ZnS).

6. A photo-conversion member comprising:
    a lower substrate;
    a photo-conversion layer on the lower substrate; and
    an upper substrate on the photo-conversion layer,
    wherein the photo-conversion layer comprises a matrix and a photo-conversion complex disposed in the matrix, and
    wherein the photo-conversion complex comprises:
    a plurality of first and second photo-conversion particles, each including a core nanocrystal, a shell nanocrystal surrounding the core nanocrystal, and a ligand bonded to the shell nanocrystal, the plurality of first photo-conversion particles converting first color light into a second color light and the plurality of second photo-conversion particles converting the first color light into a third color light; and
    a protective film surrounding the plurality of first and second photo-conversion particles,
    wherein the protective film has a band gap greater than a band gap of the shell nanocrystal, and
    wherein the protective film and the shell nanocrystal includes materials that have the same lattice constant.

7. The photo-conversion member according to claim 6, wherein the shell nanocrystal and the protective film include a same material.

8. The photo-conversion member according to claim 6, wherein at least one of the shell nanocrystal and the protective film includes zinc sulfide (ZnS).

9. The photo-conversion member according to claim 6, wherein the ligand comprises at least one of organic ligand and inorganic ligand.

10. The photo-conversion member according to claim 6, wherein the first and second photo-conversion particles each comprises a quantum dot, and
    wherein the protective film includes zinc sulfide (ZnS).

11. A display device comprising:
a backlight unit; and
a liquid crystal panel on the backlight unit,
wherein the backlight unit comprises:
a plurality of light sources mounted on a printed circuit board (PCB); and
a photo-conversion member disposed on the light sources,
wherein the photo-conversion member comprises:
a lower substrate;
an upper substrate on the lower substrate; and
a photo-conversion layer between the lower substrate and the upper substrate,
wherein the photo-conversion layer comprises:
a matrix; and
a photo-conversion complex disposed in the matrix, and
wherein the photo-conversion complex comprises:
a plurality of first and second photo-conversion particles, each including a core nanocrystal, a shell nanocrystal surrounding the core nanocrystal, and a ligand bonded to the shell nanocrystal, the plurality of first photo-conversion particles converting first color light into a second color light and the plurality of second photo-conversion particles converting the first color light into a third color light; and
a protective film surrounding the plurality of first and second photo-conversion particles,
wherein the protective film has a band gap greater than a band gap of the shell nanocrystal, and
wherein the protective film and the shell nanocrystal includes materials that have the same lattice constant.

12. The display device according to claim 11, wherein the shell nanocrystal and the protective film includes a same material.

13. The display device according to claim 11, wherein at least one of the shell nanocrystal and the protective film includes zinc sulfide (ZnS).

14. A light-emitting device package comprises:
a body portion having a cavity;
a light source disposed in the cavity;
a matrix disposed in the cavity and covering the light source; and
a plurality of photo-conversion complexes disposed in the matrix,
wherein the photo-conversion complexes comprise:
a plurality of first and second photo-conversion particles, each including a core nanocrystal, a shell nanocrystal surrounding the core nanocrystal, and a ligand bonded to the shell nanocrystal, the plurality of first photo-conversion particles converting first color light into a second color light and the plurality of second photo-conversion particles converting the first color light into a third color light; and
a protective film surrounding the plurality of first and second photo-conversion particles,
wherein the protective film has a band gap greater than a band gap of the shell nanocrystal, and
wherein the protective film and the shell nanocrystal includes materials that have the same lattice constant.

15. The light-emitting device package according to claim 14, wherein the shell nanocrystal and the protective film include a same material.

16. The light-emitting device package according to claim 14, wherein at least one of the shell nanocrystal and the protective film includes zinc sulfide (ZnS).

17. The light-emitting device package according to claim 14, wherein the first and second photo-conversion particles each comprises a quantum dot, and
wherein the protective film includes zinc sulfide (ZnS).

18. A light-emitting device package comprising:
a body portion having a cavity;
a light source disposed in the cavity;
a first matrix disposed in the cavity and covering the light source; and
a photo-conversion member disposed on the first matrix,
wherein the photo-conversion member comprises:
a lower substrate;
a photo-conversion layer on the lower substrate; and
an upper substrate on the photo-conversion layer,
wherein the photo-conversion layer comprises a second matrix and a photo-conversion complex disposed in the second matrix, and
wherein the photo-conversion complex comprises:
a plurality of first and second photo-conversion particles, each including a core nanocrystal, a shell nanocrystal surrounding the core nanocrystal, and a ligand bonded to the shell nanocrystal, the plurality of first photo-conversion particles converting first color light into a second color light and the plurality of second photo-conversion particles converting the first color light into a third color light; and
a protective film surrounding the plurality of first and second photo-conversion particles,
wherein the protective film has a band gap greater than a band gap of the shell nanocrystal, and
wherein the protective film and the shell nanocrystal includes materials that have the same lattice constant.

19. The light-emitting device package according to claim 18, wherein the at least one of the shell nanocrystal and the protective film comprises zinc sulfide (ZnS).

20. The light-emitting device package according to claim 18, wherein the first and second photo-conversion particles each comprises a quantum dot, and
wherein the protective film includes zinc sulfide (ZnS).

* * * * *